(12) United States Patent
Jeon et al.

(10) Patent No.: US 7,366,967 B2
(45) Date of Patent: Apr. 29, 2008

(54) METHODS OF TESTING SEMICONDUCTOR MEMORY DEVICES IN A VARIABLE CAS LATENCY ENVIRONMENT AND RELATED SEMICONDUCTOR TEST DEVICES

(75) Inventors: Ki-Seok Jeon, Gyeonggi-do (KR); Byound-Sul Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 306 days.

(21) Appl. No.: 10/993,023

(22) Filed: Nov. 19, 2004

(65) Prior Publication Data

US 2005/0149788 A1     Jul. 7, 2005

(30) Foreign Application Priority Data

Dec. 23, 2003    (KR) .................. 10-2003-0095135

(51) Int. Cl.
*G01R 31/28* (2006.01)
(52) U.S. Cl. .................................... 714/724
(58) Field of Classification Search ............... 714/718, 714/724, 738, 742
See application file for complete search history.

(56) References Cited

U.S. PATENT DOCUMENTS

| | | | |
|---|---|---|---|
| 5,682,393 A * | 10/1997 | Ohsawa | 713/401 |
| 6,032,275 A | 2/2000 | Tsuto | 714/720 |
| 6,427,217 B1 | 7/2002 | Hartnett | 714/733 |
| 6,505,315 B1 | 1/2003 | Kojima | 714/724 |
| 6,801,869 B2 * | 10/2004 | McCord | 702/117 |
| 7,117,404 B2 * | 10/2006 | Ernst et al. | 714/718 |

FOREIGN PATENT DOCUMENTS

WO    WO 03/052767    6/2003

* cited by examiner

*Primary Examiner*—James C. Kerveros
(74) *Attorney, Agent, or Firm*—Myers Bigel Sibley & Sajovec (57) ABSTRACT

Methods of testing a semiconductor device are provided in which a test pattern is generated for the semiconductor device that is based on the semiconductor device operating under a first CAS latency number. Then, the semiconductor device is tested using this test pattern where, at least part of the test is performed when the semiconductor device is operating under a second CAS latency number that is different from the first CAS latency number. This may be accomplished, for example, by increasing the number of clock cycles in the timing clock signal during a CAS latency-variable interval in situations where the CAS latency is changed after generation of the test pattern.

18 Claims, 9 Drawing Sheets

```
LP1:  NOP 1 : XYCLD  PINA     AWRA     DS C12 W /D2      T1 ;
             : XYCLD  PINB     LAL  YCAD1                 T1 ;
             : XYCLD  PINA                                T1 ;
             : XYCLD  PINA              C12               T1 ;
      NOP 1 : XYCLD  PINA              DS C12 W /D2      T1 ;
             : XYCLD  PINA     AWRA    DS C12 W /D2      T1 ;
             : XYCLD  PINB     LAL  YCAD1                 T1 ;
             : XYCLD  PINA                                T1 ;
      NOP 1 : XYCLD  PINA              C12               T1 ;
             : XYCLD  PINA              DS C12 W /D2      T1 ;
             : XYCLD  PINA     AWRA    DS C12 W /D2      T1 ;
             : XYCLD  PINB     LAL  YCAD1                 T1 ;
      NOP 1 : XYCLD  PINA                                T1 ;
             : XYCLD  PINA              C12               T1 ;
             : XYCLD  PINA              DS C12 W /D2      T1 ;
             : XYCLD  PINA     AWRA    DS C12 W /D2      T1 ;
JN17  LP1 1 : XYCLD  PINB     LAL  YCAD1                 T1 ;
             : XYCLD  PINA                                T1 ;
             : XYCLD  PINA              C12               T1 ;
             : XYCLD  PINA              DS C12 W /D2      T1 ;
      NOP 1 : XYCLD  PINA     YC<D3 XCINC DS C12 W /D2  T1 ;
             : XYCLD  PINA                                T1 ;
             : XYCLD  PINA                                T1 ;
             : XYCLD  PINA                                T1 ;
JN12  LP1   : XYCLD  PINA                                T1 ;
             : XYCLD  PINA                                T1 ;
             : XYCLD  PINA                                T1 ;
             : XYCLD  PINA                                T1 ;
      RTN   : XYCLD  PINA                                T1 ;
             : XYCLD  PINA                                T1 ;
             : XYCLD  PINA                                T1 ;
             : XYCLD  PINA                                T1 ;
```

```
LP1: NOP I : XYCLD PINA     AWRA     DS C12 W /D2    T1 ;
            : XYCLD PINB    LAL  YCAD1                T1 ;
            : XYCLD PINA                              T1 ;
            : XYCLD PINA              C12             T1 ;
     NOP I : XYCLD PINA              DS C12 W /D2    T1 ;
            : XYCLD PINA    AWRA     DS C12 W /D2    T1 ;
            : XYCLD PINB    LAL  YCAD1                T1 ;
            : XYCLD PINA                              T1 ;
     NOP I : XYCLD PINA              C12             T1 ;
            : XYCLD PINA              DS C12 W /D2    T1 ;
            : XYCLD PINA    AWRA     DS C12 W /D2    T1 ;
            : XYCLD PINB    LAL  YCAD1                T1 ;
     NOP I : XYCLD PINA                              T1 ;
            : XYCLD PINA              C12             T1 ;
            : XYCLD PINA              DS C12 W /D2    T1 ;
            : XYCLD PINA    AWRA     DS C12 W /D2    T1 ;
JN17 LP1 I : XYCLD PINB    LAL  YCAD1                T1 ;
            : XYCLD PINA                              T1 ;
            : XYCLD PINA              C12             T1 ;
            : XYCLD PINA              DS C12 W /D2    T1 ;
     NOP I : XYCLD PINA    YC<DS XCINC DS C12 W /D2   T1 ;
            : XYCLD PINA                              T1 ;
            : XYCLD PINA                              T1 ;
            : XYCLD PINA                              T1 ;
JN12 LP1   : XYCLD PINA                              T1 ;
            : XYCLD PINA                              T1 ;
            : XYCLD PINA                              T1 ;
            : XYCLD PINA                              T1 ;
     RTN   : XYCLD PINA                              T1 ;
            : XYCLD PINA                              T1 ;
            : XYCLD PINA                              T1 ;
            . XYCLD PINA                              T1 ;
```

FIG. 7

```
LP1:  NOP I : XYCLD  PINA    AWRA     DS C12 W /D2      T1 ;
            : XYCLD  PINB    LAL   YCAD1                T1 ;
            : XYCLD  PINA                               T1 ;
            : XYCLD  PINA             C12               T1 ;
      NOP I : XYCLD  PINA             DS C12 W /D2      T1 ;
            : XYCLD  PINA    AWRA     DS C12 W /D2      T1 ;
            : XYCLD  PINB    LAL   YCAD1                T1 ;
            : XYCLD  PINA                               T1 ;
      NOP I : XYCLD  PINA             C12               T1 ;
            : XYCLD  PINA             DS C12 W /D2      T1 ;
            : XYCLD  PINA    AWRA     DS C12 W /D2      T1 ;
            : XYCLD  PINB    LAL   YCAD1                T1 ;
      NOP I : XYCLD  PINA                               T1 ;
            : XYCLD  PINA             C12               T1 ;
            : XYCLD  PINA             DS C12 W /D2      T1 ;
            : XYCLD  PINA    AWRA     DS C12 W /D2      T1 ;
JN17  LP1 I : XYCLD  PINB    LAL   YCAD1                T1 ;
            : XYCLD  PINA                               T1 ;
            : XYCLD  PINA             C12               T1 ;
            : XYCLD  PINA             DS C12 W /D2      T1 ;
      NOP 1 : XYCLD  PINA    YC4X3 XCINC DS C12 W /D2   T1 ;
            : XYCLD  PINA                               T1 ;
            : XYCLD  PINA                               T1 ;
            : XYCLD  PINA                               T1 ;
JN12  LP1   : XYCLD  PINA                               T1 ;
            : XYCLD  PINA                               T1 ;
            : XYCLD  PINA                               T1 ;
            : XYCLD  PINA                               T1 ;
      RTN   : XYCLD  PINA                               T1 ;
            : XYCLD  PINA                               T1 ;
            : XYCLD  PINA                               T1 ;
            : XYCLD  PINA                               T1 ;
```

FIG. 8

```
LP1: NOP I : XYCLD  PINA      AWRA       DS C12 W /D2      T1 ;
            : XYCLD  PINB      LAL  YCAD1                  T1 ;
            : XYCLD  PINA                                  Tx ;
            : XYCLD  PINA                  C12             Tx ;
      NOP I : XYCLD  PINA                DS C12 W /D2      T1 ;
            : XYCLD  PINA      AWRA       DS C12 W /D2     T1 ;
            : XYCLD  PINB      LAL  YCAD1                  T1 ;
            : XYCLD  PINA                                  Tx ;
      NOP I : XYCLD  PINA                  C12             Tx ;
            : XYCLD  PINA                DS C12 W /D2      T1 ;
            : XYCLD  PINA      AWRA       DS C12 W /D2     T1 ;
            : XYCLD  PINB      LAL  YCAD1                  T1 ;
      NOP I : XYCLD  PINA                                  Tx ;
            : XYCLD  PINA                  C12             Tx ;
            : XYCLD  PINA                DS C12 W /D2      T1 ;
            : XYCLD  PINA      AWRA       DS C12 W /D2     T1 ;
JN17  LP1 I : XYCLD  PINB      LAL  YCAD1                  T1 ;
            : XYCLD  PINA                                  Tx ;
            : XYCLD  PINA                  C12             Tx ;
            : XYCLD  PINA                DS C12 W /D2      T1 ;
      NOP I : XYCLD  PINA      YCADD XCINC DS C12 W /D2    T1 ;
            : XYCLD  PINA                                  T1 ;
            : XYCLD  PINA                                  T1 ;
            : XYCLD  PINA                                  T1 ;
JN12  LP1  : XYCLD  PINA                                   T1 ;
            : XYCLD  PINA                                  T1 ;
            : XYCLD  PINA                                  T1 ;
            : XYCLD  PINA                                  T1 ;
      RTN  : XYCLD  PINA                                   T1 ;
            : XYCLD  PINA                                  T1 ;
            : XYCLD  PINA                                  T1 ;
            : XYCLD  PINA                                  T1 ;
```

METHODS OF TESTING SEMICONDUCTOR MEMORY DEVICES IN A VARIABLE CAS LATENCY ENVIRONMENT AND RELATED SEMICONDUCTOR TEST DEVICES

CROSS-REFERENCE TO RELATED APPLICATION

This application claims priority under 35 U.S.C. § 119 from Korean Patent Application No. 2003-95135, filed on Dec. 23, 2003, the disclosure of which is incorporated herein by reference as if set forth in its entirety.

FIELD OF THE INVENTION

This invention relates to semiconductor test devices and, more particularly, to methods of testing semiconductor devices using adjustable timing clock signals and related semiconductor test devices.

BACKGROUND OF THE INVENTION

Semiconductor device manufacturers often perform systematic tests to determine whether or not the semiconductor devices that they manufacture satisfy certain design parameters. The tests performed may include, for example, device parameter tests (DC testing), device logic function tests and/or device timing tests (AC testing). The semiconductor device being tested is sometimes called the Device Under Test or "DUT." The test system used to perform the tests on the DUT is often referred to as Automatic Test Equipment or "ATE."

Typically, the ATE is controlled by a computer that may provide voltage, current, timing, functional status and/or other information to and from the DUT. The computer may also execute a test program that monitors the response of the DUT to the respective tests. The results of the tests may, for example, be compared with predetermined thresholds to make decisions as to whether or not the DUT passed or failed a test at issue. The ATE may include, for example, a power supply, a counter, a signal generator, and a pattern generator. A Pin Electronics or "PE" circuit may be used as an interface between the ATE and the DUT to provide input signals to the DUT and receive output signals from the DUT. For example, during a device parameter test, the PE circuit might apply an input voltage to the DUT and receive an output current from the DUT, or might apply an input current to the DUT and receive an output voltage from the DUT.

A semiconductor test device is disclosed in International Patent Publication No. WO 2003/052767. This test device may be used to test a plurality of semiconductor devices simultaneously. The test device may input the same test data pattern waveform to the same pin of a plurality of semiconductor devices to perform the testing.

Figure 1:
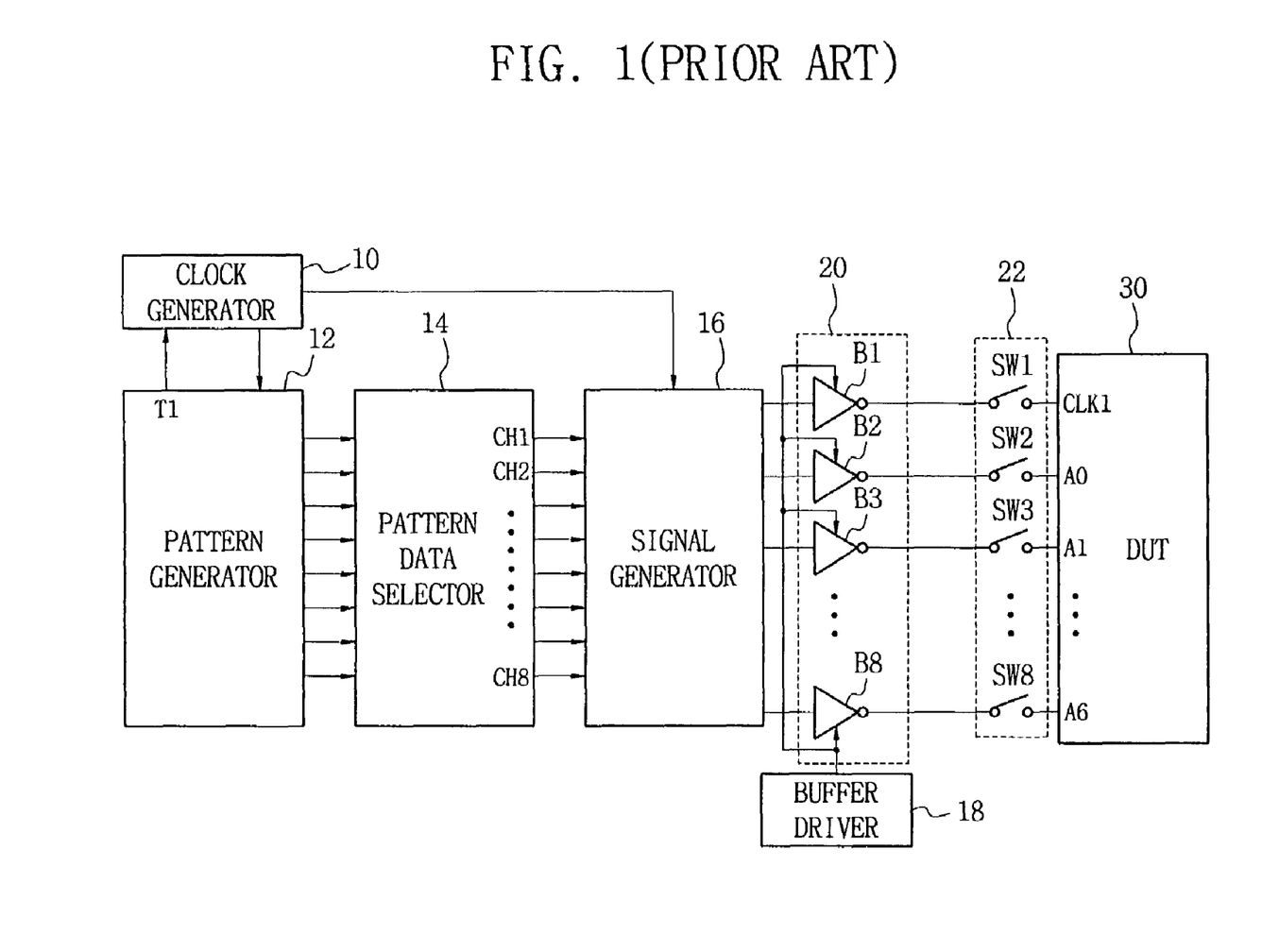
FIG. 1 is a block diagram of a conventional semiconductor test device.

FIG. 1 is a schematic of a conventional semiconductor test device that may be used to test a semiconductor memory device. The memory device may comprise, for example, a dynamic random access memory device ("DRAM"). As shown in FIG. 1, the device may include a clock signal generator 10 for generating a timing clock signal CLK. The device further includes a pattern generator 12, such as an algorithmic pattern generator, that transmits a clock signal generation start signal T1 to the clock signal generator 10, receives the clock signal CLK from the clock signal generator 10 and generates an address pattern, a data pattern, and/or a control pattern. The device further includes a pattern data selector 14 that allocates channels to the address pattern, the data pattern and/or the control pattern that are received from the pattern generator 12. A signal generator 16 such as a timing generator format controller may be provided that generates the actual test data in synchronization with the timing clock signal CLK based on the pattern data output from the pattern data selector 14. A buffer driver 18 is provided that generates a buffer driving signal, and a plurality of buffers 20 are used to buffer the test data generated by the signal generator 16. A plurality of switches 22 are provided that switch the data output from the plurality of buffers 22 to the DUT 30.

Figure 2:
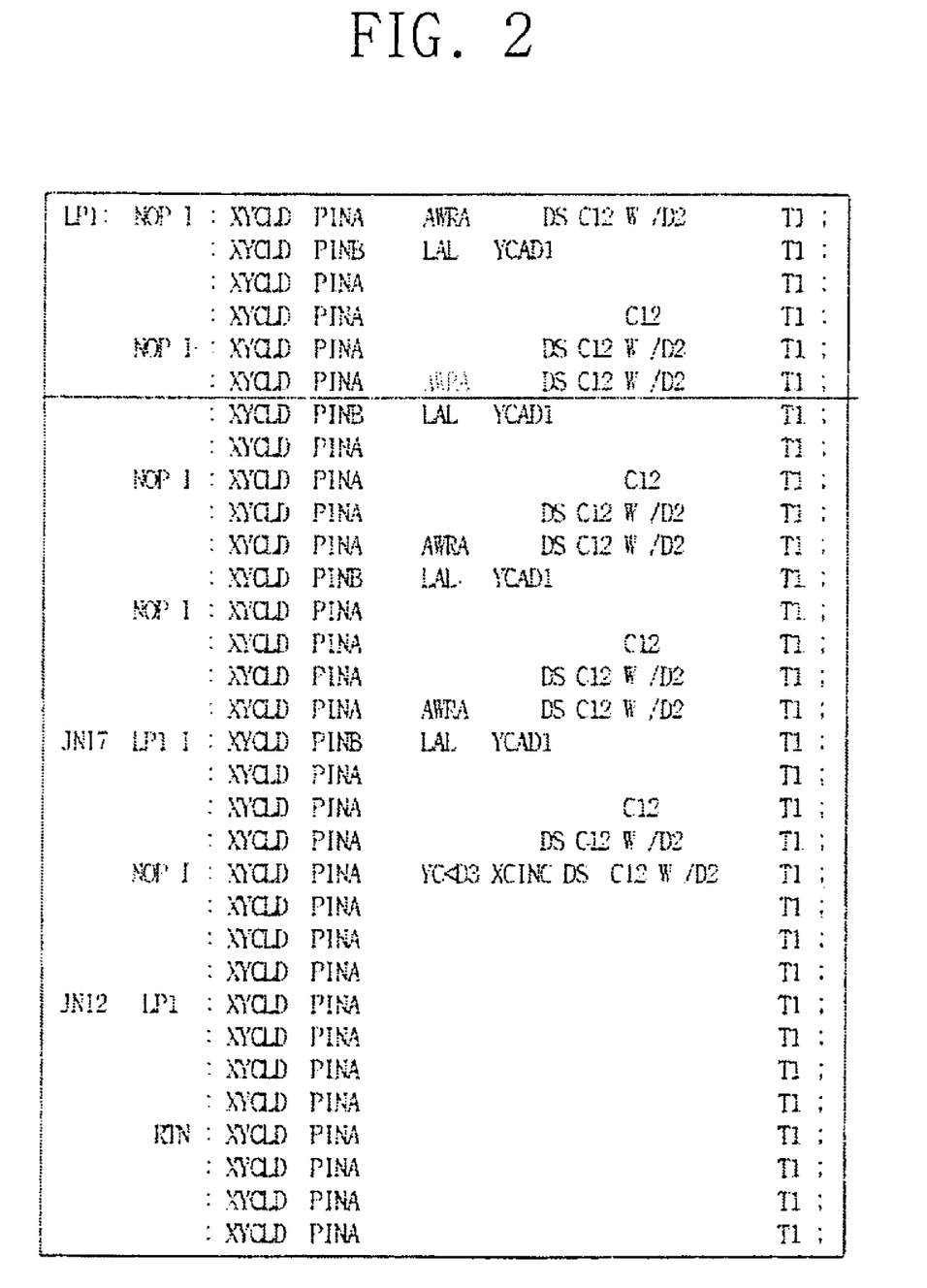
FIGS. 2 and 3 are diagrams illustrating conventional test patterns.
Figure 3:
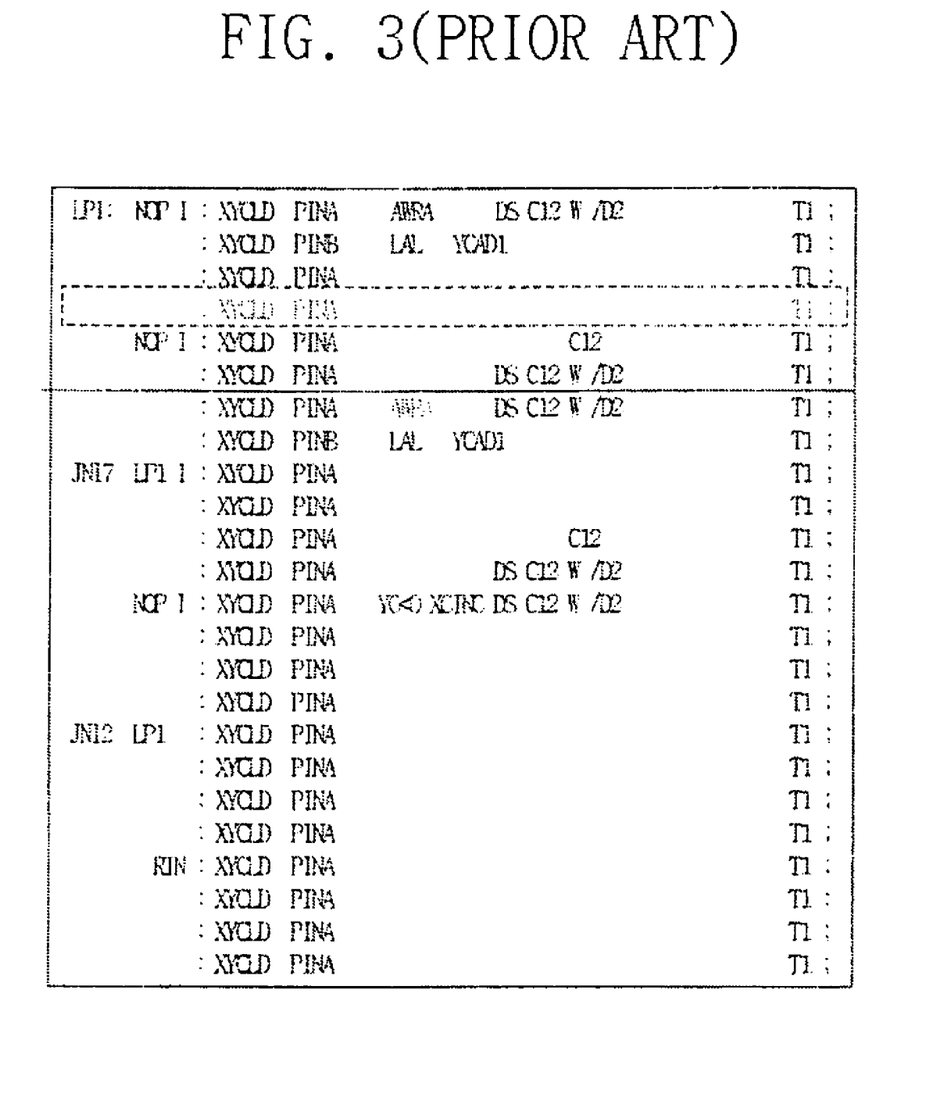
Figure 4:
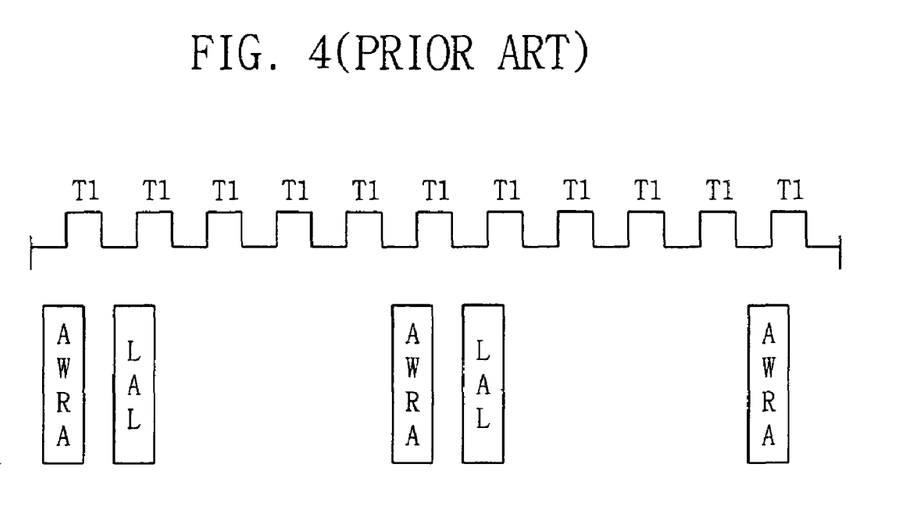
FIG. 4 is a timing diagram showing generation of timing clock signals according to a conventional Xmarch CL4 pattern.

FIGS. 2 and 3 are exemplary diagrams of a conventional test pattern. In particular, FIG. 2 shows an Xmarch CL4 pattern, and FIG. 3 shows an Xmarch CL5 pattern. In FIGS. 2 and 3, AWRA refers to an "active read command", and LAL is a "second command." FIG. 4 is a timing diagram illustrating the generation of timing clock signals according to the conventional Xmarch CL4 pattern of FIG. 2.

Aspects of the present invention relate to semiconductor memory devices that use Column Address Strobe or "CAS" techniques. As will be understood by persons of skill in the art, CAS latency involves the period of time (or number of clock cycles) that must pass before the data that is output in a read operation appears on the output pins. As used herein, the term "CAS latency number" refers to the number of clock cycles of a clock signal that is synchronized with an external command that must pass after application of a read or write command before the input/output data can be presumed valid.

Operations for outputting test pattern data using the conventional test device of FIG. 1 will now be described with reference FIGS. 1-4. Operations may begin with the clock signal generator 10 receiving a clock signal generation start signal T1 from the pattern generator 12. The clock signal generator 10 generates a timing clock signal CLK in response to the start signal T1. The pattern generator 12 receives the clock signal CLK from the clock signal generator 10 and generates a test pattern that comprises an address pattern, a data pattern and a control pattern. These patterns are output to the pattern data selector 14. The test pattern may be designed, for example, to generate commands to read or write data to/from the DUT after four or five cycles of a clock signal. In particular, the test pattern may be generated according to the CAS latency number. The pattern data selector 14 allocates channels to the address pattern, the data pattern and the control pattern and outputs the channel-allocated patterns to the signal generator 16. The signal generator 16 generates actual test data based on the pattern data allocated by the pattern data selector 14 in synchronization with the timing clock signal CLK, and outputs the generated data to the respective buffers 20. The buffer driver 18 generates a buffer driving signal and applies it to the respective buffers 20. The plurality of buffers 20 buffer the actual test data according to the buffer driving signal output from the buffer driver 18 and apply the buffered data to the respective switches 22. The plurality of switches 22 switch on to output the data in the buffers 20 to the DUT 30.

Thus, the pattern generator 12 of the above-described conventional semiconductor test device generates a test pattern that has a CAS latency number that, for example, corresponds to the test pattern of FIG. 2 or 3, and the signal generator 16 generates actual test data based on the test pattern and transmits the generated test data to the DUT 30.

When the test pattern is formed with a four-cycle clock signal 4CLK as shown, for example, in FIG. 2, the conventional semiconductor test device generates an active read command for reading data after the generation of four cycles of the clock signal CLK (see FIG. 4). However, if the CAS latency number of the semiconductor device is changed, for example, from four to five, a whole new set of test patterns is required. Accordingly, an increase or decrease of one in the CAS latency number requires a doubling in the number of test patterns required. Larger increases (or decreases) in the CAS latency number require a corresponding increase in the number of test patterns to twice the change in the CAS latency number. As the number of test patterns increases, the likelihood human errors in programming and/or verification of the test patterns increases.

SUMMARY OF THE INVENTION

Pursuant to embodiments of the present invention, methods of testing a semiconductor device are provided in which a test pattern is generated for the semiconductor device that is based on the semiconductor device operating under a first CAS latency number. Then, the semiconductor device is tested using this test pattern where, at least part of the test is performed when the semiconductor device is operating under a second CAS latency number that is different from the first CAS latency number. The second CAS latency number may be greater than the first CAS latency number.

The method may further include increasing the number of clock pulses in a clock signal that is provided to the semiconductor device during the part of the test when the semiconductor device is operating under the second CAS latency number. This may be done, for example, by selectively providing a first clock signal or a second clock signal to the semiconductor device, where the first clock signal comprises a clock signal that is used to control the operation of a test device and the second clock signal comprises a latency increasing time signal. The second clock signal may be selectively provided to the semiconductor device for periods of at least two clock cycles of the first clock signal. Moreover, the second clock signal may be generated in embodiments of the present invention by performing a logical-OR operation on the first clock signal and a CAS-latency increasing signal. A multiplexer may be used to selectively provide the first clock signal and the second clock signal to the semiconductor device.

Pursuant to further embodiments of the present invention, methods of testing a semiconductor memory device are provided in which a test pattern is generated that is associated with a first CAS latency number. A change in the CAS latency number may then be received. A clock signal that is provided to the semiconductor device may be modified in response to the change in the CAS latency number. The semiconductor device may then be tested using the test pattern and the modified clock signal.

The clock signal that is provided to the semiconductor device in response to the change in the CAS latency number may be modified by inserting at least one additional clock pulse into the clock signal pattern during each of a plurality of read or write operations. This may be done, for example, by selectively providing a first clock signal or a second clock signal to the semiconductor device, where the second clock signal is used to selectively replace a pulse of the first clock signal with at least two pulses. The second clock signal may be a latency increasing clock signal that is generated by a signal generator.

Pursuant to still further embodiments of the present invention, semiconductor test devices are provided which include an automatic test device that is configured to output a clock signal and a plurality of data signals and a clock pulse insertion circuit that is configured to selectively insert clock pulses into the clock signal output by the automatic test device. The clock pulse insertion circuit may be configured to selectively insert clock pulses into the clock signal in response to an increase in a CAS latency number. The clock pulse insertion circuit may include a multiplexer that is configured to selectively outputs the clock signal from the automatic test device and a second clock signal. The clock pulse insertion circuit may also include an OR gate that is configured to receive both the clock signal from the automatic test device and a latency changing timing signal. In such embodiments, the inputs to the multiplexer may comprise the clock signal from the automatic test device and the output of the OR gate.

Pursuant to further embodiments of the present invention, semiconductor test devices are provided which include a clock signal generator, a pattern generator, a pattern data selector, a signal generator, a buffer driver, a buffer section and a clock signal inserter. The clock signal inserted may be configured to receive a timing clock signal CLK and a latency-increasing timing signal output from the buffer section to generate a latency-increased timing clock signal CLK1. In certain embodiments, the clock signal inserter may comprise a logic gate that performs a logical OR operation on the timing clock signal CLK and the CAS latency-increasing signal to generate the clock signal inserted to increase the CAS latency and a multiplexer for that outputs the timing clock signal CLK and the clock signal inserted to increase the CAS latency during a CAS latency-increasing interval of the timing clock signal CLK according to a timing control signal Tx.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
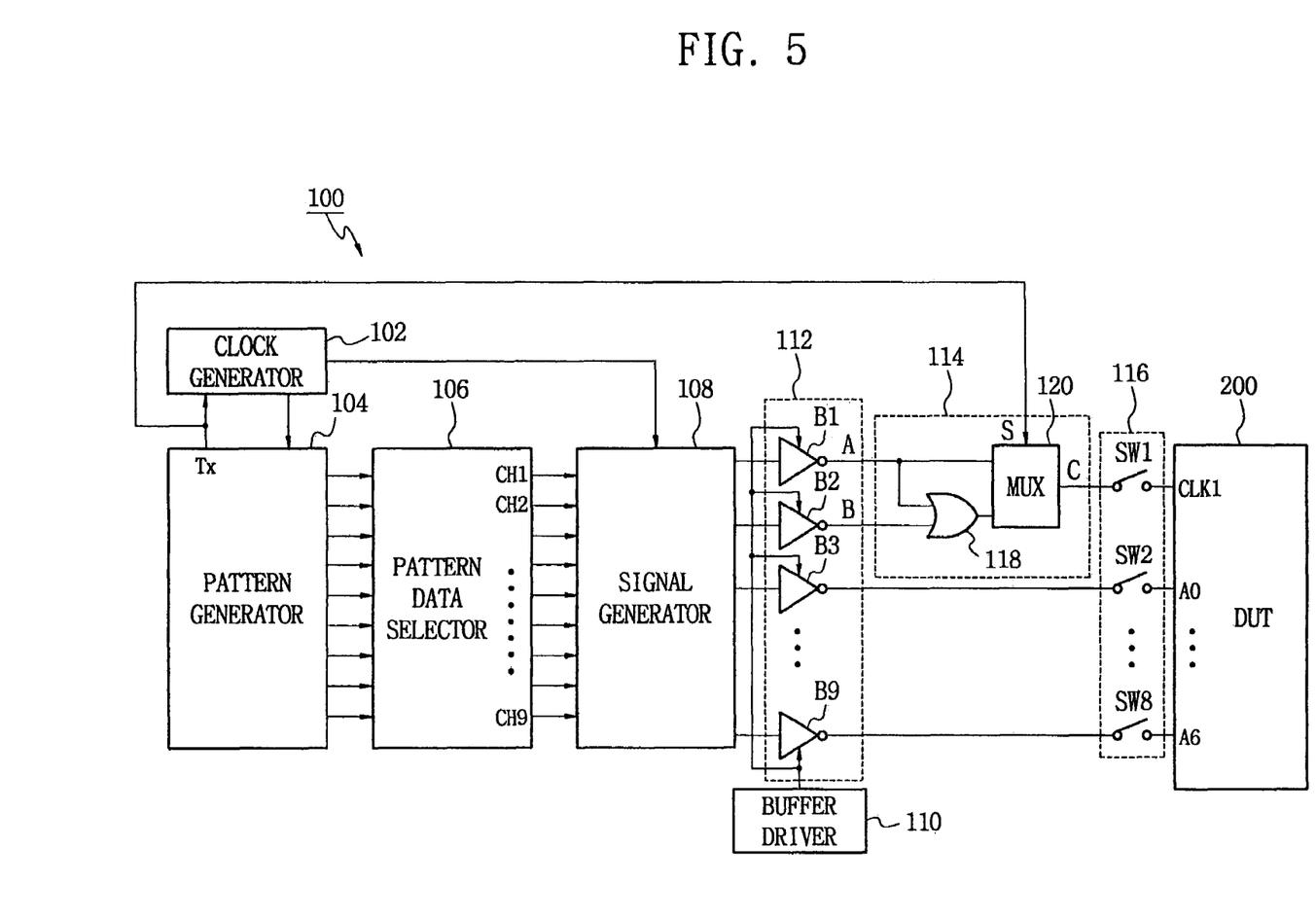
FIG. 5 is a block diagram of a semiconductor test device according to certain embodiments of the present invention.

FIG. 5 is a block diagram of a semiconductor test device 100 according to certain embodiments of the present invention.

As shown in FIG. 5, the semiconductor test device 100 includes a clock signal generator 102 that generates a timing clock signal CLK in response to a timing control signal Tx. The timing control signal Tx is generated by a pattern generator 104. The pattern generator further receives the clock signal CLK from the clock signal generator 102, and generates an address pattern, a data pattern, a control pattern and an insertion clock signal generation control signal in response thereto. A pattern data selector 106 is responsive to the pattern generator 104. The pattern data selector 106 allocates channels to the address pattern, the data pattern, the control pattern and the insertion clock signal generation control signal. A signal generator 108 is further provided that may be used to generate both the actual test data and a latency-increasing timing signal based on the pattern data allocated from the pattern data selector 106 in synchronization with the timing clock signal CLK. A buffer driver 110 is provided that generates a buffer driving signal that controls a plurality of buffers 112 that buffer the actual test data and the latency-increasing timing signal. A clock signal inserter 114 receives the timing clock signal CLK and the latency-increasing timing signal output from one of the buffers 112 and outputs a timing clock signal CLK1 under the control of the pattern generator 104. A switching section 116 is provided, and a DUT 200 is connected to the semiconductor test device 100 via the switching section 116. In the illustrated embodiment, the buffer section 112 includes buffers B1 through B8, and the switching section 116 includes switches SW1 through SW8.

Figure 6:
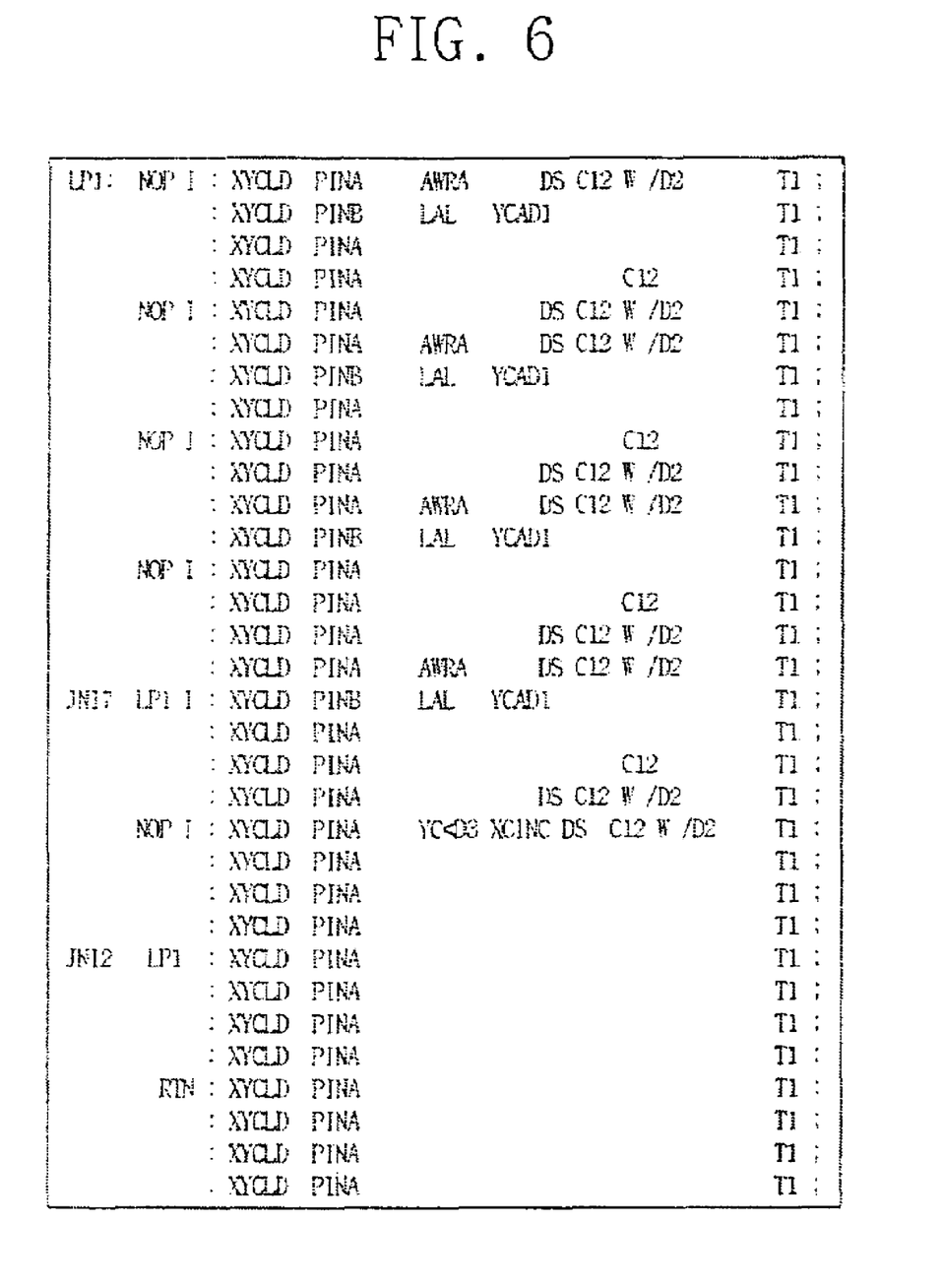
FIGS. 6 to 8 are diagrams of test patterns according to embodiments of the present invention.
Figure 7:
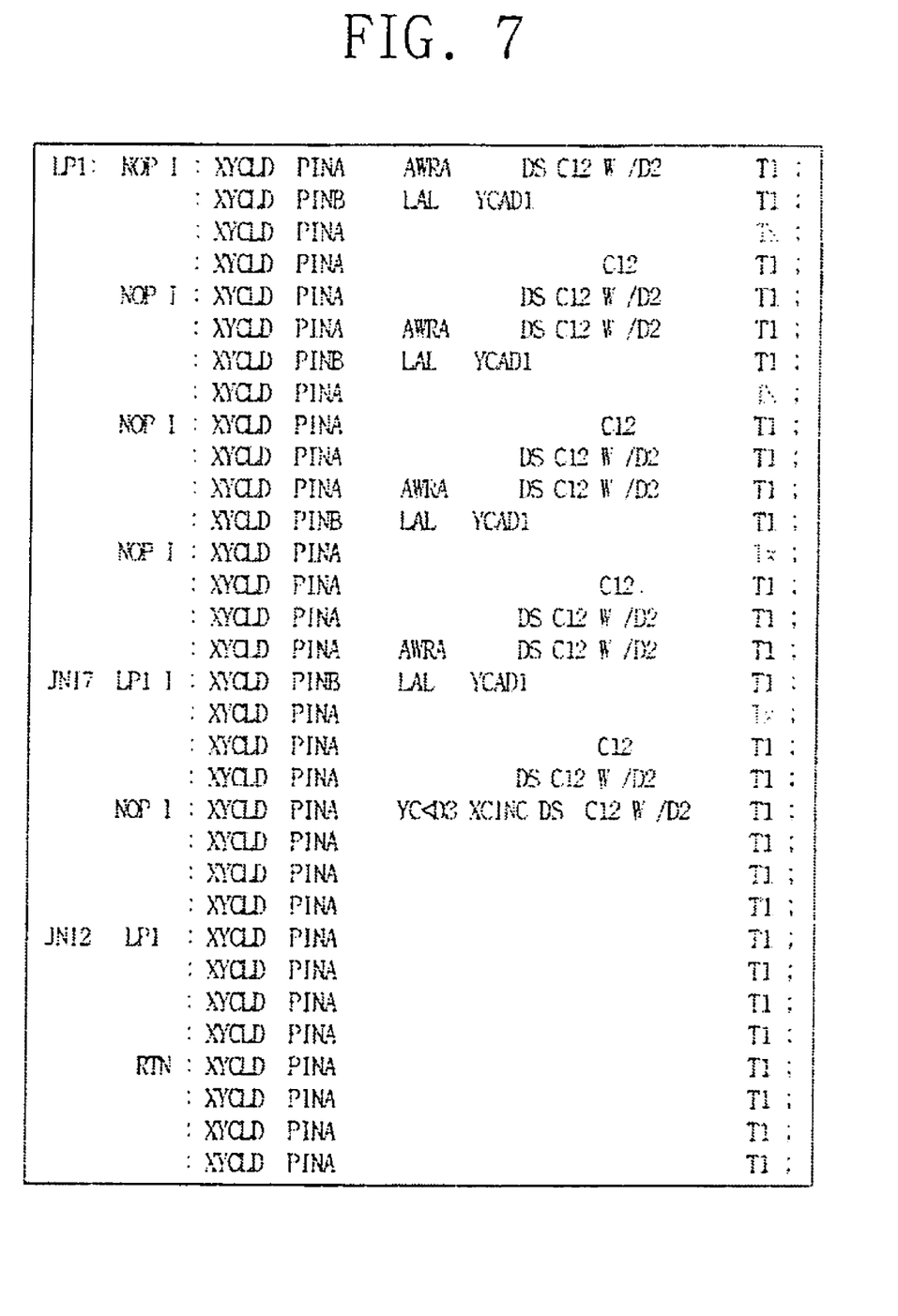
Figure 8:
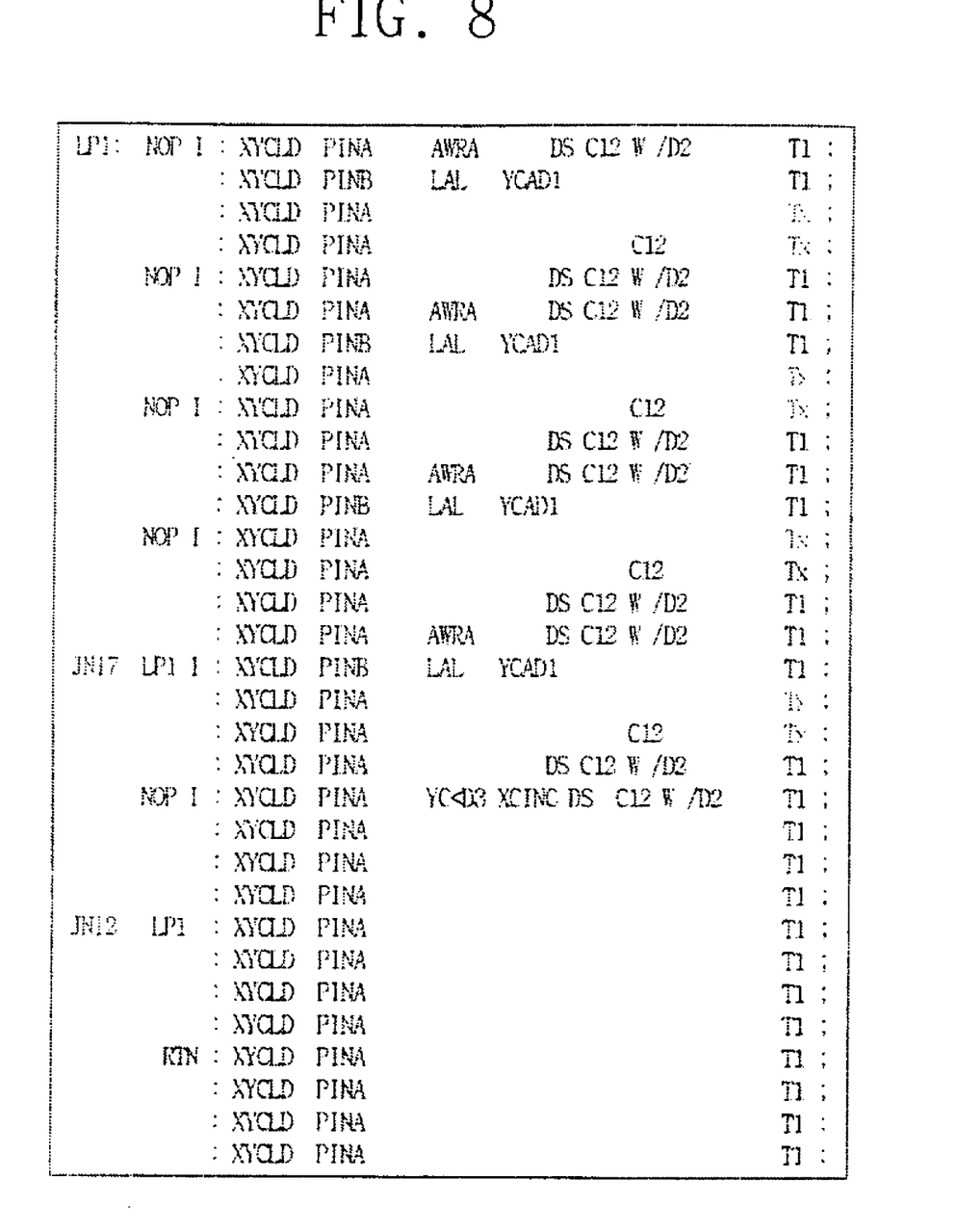
Figure 9:
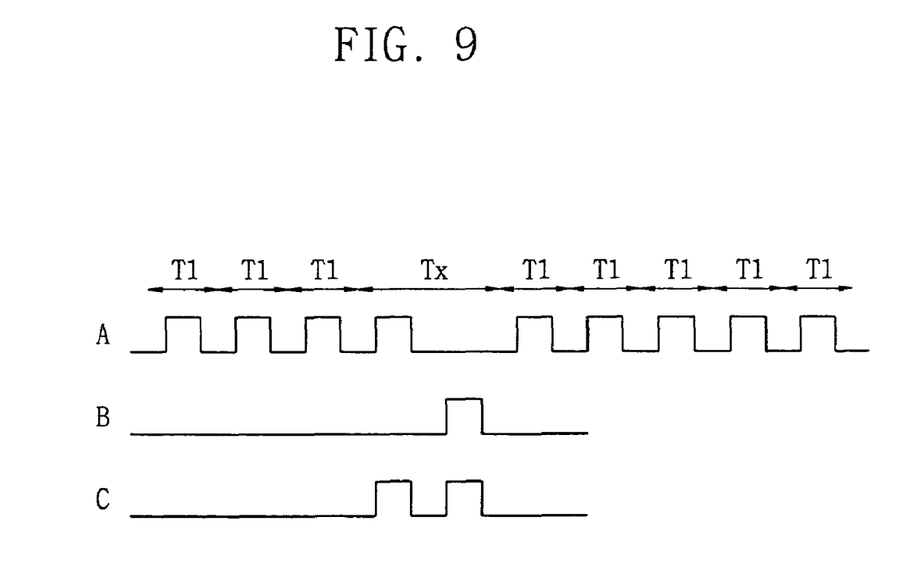
FIG. 9 is a timing diagram illustrating the operation of a clock signal inserter according to certain embodiments of the present invention.

FIGS. 6 to 8 are diagrams of exemplary test patterns according to certain embodiments of the present invention. In particular, FIG. 6 depicts a portion of an Xmarch 1Bank CL4 pattern, FIG. 7 depicts a portion of an Xmarch CL5 pattern, and FIG. 8 depicts a portion of an Xmarch CL6 pattern. As will be appreciated by those of skill in the art, in FIGS. 6-8, Xmarch refers to a test pattern that operates in the row (word line) direction, and Ymarch (not shown) refers to a test pattern that operates in the column (bit line) direction. AWRA refers to an "Active Read Command", and LAL is a "Second Command." FIG. 9 is a timing diagram of the operation of the clock signal inserter 114 according to certain embodiments of the present invention.

Figure 10:
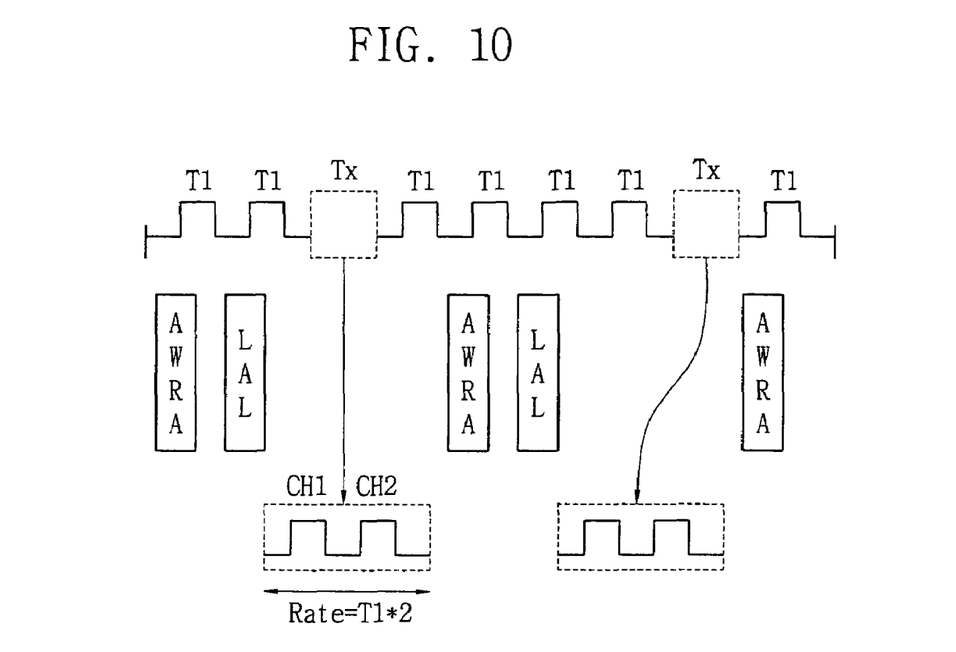
FIG. 10 is a diagram illustrating generation of timing clock signals for an Xmarch CL5 pattern according to certain embodiments of the present invention.
Figure 11:
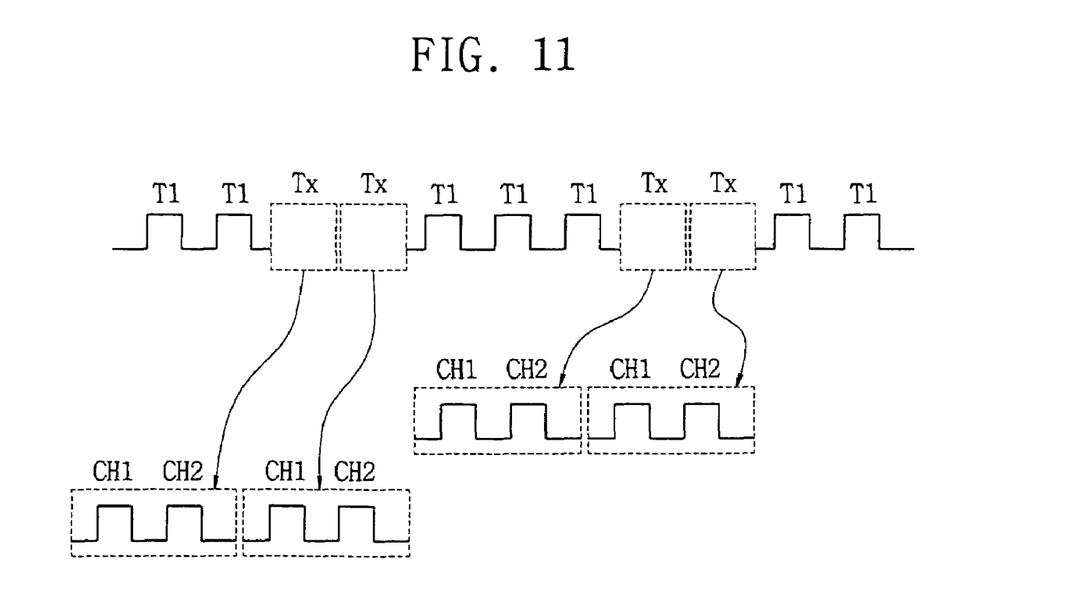
FIG. 11 is a diagram illustrating generation of timing clock signals for an Xmarch CL6 pattern according to certain embodiments of the present invention.

FIG. 10 is a diagram illustrating generation of timing clock signals for the Xmarch CL5 pattern according to certain embodiments of the present invention. FIG. 11 is a diagram illustrating generation of timing clock signals for the Xmarch CL6 pattern according to certain embodiments of the present invention.

Operations for outputting test pattern data according to certain embodiments of the present invention will now be described with reference to FIGS. 5-11. Operations may start with the clock signal generator 102 generating a timing clock signal CLK in response to a defined timing control signal Tx from the pattern generator 104. The pattern generator 104 receives the timing clock signal CLK and generates an address pattern, a data pattern, a control pattern and an insertion clock signal generation control signal, each of which may be provided to the pattern data selector 106. The test pattern generated by the pattern generator 104 is based on a CAS latency number. For example, if the CAS latency number is four, the test pattern may be designed such that data is read from or written to the DUT after four cycles of the clock signal. With conventional semiconductor test devices, if the test pattern needs to be changed (due, for example, to a change in the CAS latency number) such that data is read from or written to the DUT after, for example, generation of five or six cycles of the clock signal CLK, additional test patterns are formed by a program and generated from the pattern generator 104.

According to embodiments of the present invention, the pattern generator 104 may be used to generate, for example, a test pattern for reading/writing data after generation of four cycles of the clock signal CLK (i.e., a CAS latency number of four). If, thereafter, the CAS latency number is changed to five or six, the pattern generator 104 may (1) apply a timing control signal (e.g., signal Tx) to a selection terminal S of a multiplexer ("MUX") 120 and (2) receive the timing clock signal CLK from the clock signal generator 102 to generate a CAS latency-increasing timing control signal and an insertion clock signal generation control signal, each of which are provided to the pattern data selector 106. The pattern data selector 106 may then allocate two of the channels, such as, for example, first and second channels CH1 and CH2, to the insertion clock signal generation control signal generated from the pattern generator 104, and allocate the remaining channels (e.g., third through ninth channels CH3 to CH9) to output an address pattern, a data pattern, and a control pattern to the signal generator 108. The signal generator 108 generates actual test data, a timing clock signal CLK and a CAS latency-increasing signal based on the pattern data and the insertion clock signal generation control signal generated from the pattern data selector 106 in synchronization with the timing clock signal CLK, and outputs them to first and second buffers B1 and B2 of the plurality of buffers 112. The buffer driver 110 generates a buffer driving signal and applies the generated buffer driving signal to the plurality of buffers 112. The plurality of buffers 112 buffer the actual test data, the timing clock signal CLK and the CAS latency-increasing signal generated from the signal generator 108 according to the buffer driving signal output from the buffer driver 110. The timing clock signal CLK and the CAS latency-increasing signal buffered in the first and second buffers B1 and B2, respectively, are then applied to an OR gate 118. The OR gate 118 performs a logical OR operation on the timing clock signal CLK and the CAS latency-increasing signal and outputs clock signals which are inserted to increase the CAS latency.

By way of example, the pattern generator 104 may be used to generate the test pattern of FIG. 6 for reading/writing data after generation of four cycles of the clock signal CLK. When the test pattern of FIG. 6 is changed to a test pattern of FIG. 7 for reading/writing data after generation of five timing clock signals CLK, the signal generator 108 outputs a timing clock signal CLK to the first buffer B1 and a CAS latency-increasing signal to the second buffer B2. The timing clock signal CLK is illustrated as waveform "A" of FIG. 9, and the CAS latency-increasing signal is illustrated as waveform "B" of FIG. 9. As shown in FIG. 5, the timing clock signal CLK output from the first buffer B1 is input to a first input of the MUX 120. Additionally, the OR gate 118 performs a logical OR operation on the timing clock signal CLK output from the first buffer B1 and the CAS latency-increasing signal output from the second buffer B2 to produce a CAS latency-increasing clock signal to the other input of the MUX 120. This CAS latency-increasing clock signal is illustrated as waveform "C" in FIG. 9 The MUX 120 selectively outputs a portion of the timing clock signal CLK from the first buffer B1 (i.e., waveform "A" of FIG. 9) and the CAS latency-increasing clock signal (i.e., waveform "C" of FIG. 9). In particular, the MUX 120 outputs the first three cycles of the timing clock signal CLK and then the CAS latency-increasing clock signal is output according to the timing of the control signal Tx output from the pattern generator 104. Namely, the MUX 120 outputs the first three cycles of the waveform designated "A" in FIG. 9 then outputs the CAS latency-increasing clock signal that is designated as waveform "C" in FIG. 9 (which is the same as two cycles of the timing clock signal CLK) during the fourth cycle of the timing clock signal CLK. Thereafter, the MUX 120 selectively outputs the timing clock signal CLK. The first cycle of the timing clock signal CLK is an active read command AWRA, and the second cycle is a second command LAL. The timing clock signal CLK1 selected by the MUX 120 is transmitted to the DUT 200 via the plurality of the switches 116. This operation is iteratively performed to insert the CAS latency-increasing clock signal of FIG. 10 every second-cycle interval after generation of the timing clock signal synchronized with the AWRA and read data, thereby testing the semiconductor device.

As another example, again assume that the pattern generator 104 generates the test pattern of FIG. 6 for reading/writing data after generation of four cycles of the timing clock signal CLK. When the test pattern thereafter is changed to, for example, the test pattern of FIG. 8 for reading/writing data after generation of six cycles of the timing clock signal CLK, the signal generator 108 outputs the timing clock signal CLK (waveform "A" in FIG. 9) to the first buffer B1 and the CAS latency-increasing signal (waveform "B" in FIG. 9) to the second buffer B2. The timing clock signal CLK output from the first buffer B1 is input to a first input of the MUX 120. Additionally, the OR gate 118 performs a logical OR operation on the third cycle of the timing clock signal CLK output from the first buffer B1 and the CAS latency-increasing signal output from the second buffer B2, and outputs a clock signal that is inserted to increase the CAS latency (see signal "C" in FIG. 9) to the other input the MUX 120. The MUX 120 selectively outputs the timing clock signal CLK output from the first buffer B1 and, after generation of the second clock signal LAL, the CAS latency-increasing clock signal that is fed into the other input of the MUX 120 according to the timing control signal Tx output from the pattern generator 104. Namely, the MUX 120 outputs the timing clock signal CLK (waveform "A" of FIG. 9) up to the second cycle and then selects the CAS latency-increasing clock signal (waveform "C" of FIG. 9) in the third cycle of the timing clock signal CLK. Thereafter, the MUX 120 selects the clock signal inserted to increase the latency (waveform "C" of FIG. 9) output from the OR gate 118 again in the fourth cycle of the timing clock signal CLK. The timing clock signal CLK1 generated by the MUX 120 is transmitted to the DUT 200 via the first switch SW1 of the switching section 116. This operation is iteratively performed to insert the CAS latency-increasing clock signal of FIG. 11 every second- and third-cycle interval after generation of the timing clock signal synchronized with the AWRA and read data, thereby testing the semiconductor device.

As described above, embodiments of the present invention may reduce the burden for programming and verification by generating more timing clock signals in a CAS latency-increasing interval without the need to develop a separate program for a test pattern when the latency of the test pattern for testing a semiconductor device changes.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of testing a semiconductor device, the method comprising:
    generating a test pattern for the semiconductor device that is based on the semiconductor device operating under a first Column Address Strobe latency number; and
    writing the test pattern to the semiconductor device, wherein the test pattern is written to the semiconductor device when the semiconductor device is operating under a second Column Address Strobe latency number that is different from the first Column Address Strobe latency number.

2. The method of claim 1, wherein the second Column Address Strobe latency number is greater than the first Column Address Strobe latency number.

3. A method of testing a semiconductor device, the method comprising:
    generating a test pattern for the semiconductor device that is based on the semiconductor device operating under a first Column Address Strobe latency number;
    testing the semiconductor device using the test pattern, wherein at least part of the test is performed when the semiconductor device is operating under a second Column Address Strobe latency number that is different from the first Column Address Strobe latency number; and increasing the number of clock pulses in a clock signal that is provided to the semiconductor device during the part of the test when the semiconductor device is operating under the second Column Address Strobe latency number.

4. The method of claim 3, wherein increasing the number of clock pulses in the clock signal that is provided to the semiconductor device during the part of the test when the semiconductor device is operating under the second Column Address Strobe latency number comprises selectively providing a first clock signal or a second clock signal to the semiconductor device, wherein the first clock signal comprises a clock signal that is used to control the operation of a test device and the second clock signal comprises a latency increasing time signal.

5. The method of claim 4, wherein the second clock signal is selectively provided to the semiconductor device for periods of at least two clock cycles of the first clock signal.

6. The method of claim 4, further comprising performing a logical-OR operation on the first clock signal and a Column Address Strobe-latency increasing signal to provide the second clock signal.

7. The method of claim 5, wherein a multiplexer is used to selectively provide the first clock signal and the second clock signal to the semiconductor device.

8. A method of testing a semiconductor device, the method comprising:

generating a test pattern associated with a first Column Address Strobe latency number;

receiving a change in the Column Address Strobe latency number;

modifying a clock signal that is provided to the semiconductor device in response to the change in the Column Address Strobe latency number; and testing the semiconductor device using the test pattern and the modified clock signal.

9. The method of claim 8, wherein modifying the clock signal that is provided to the semiconductor device in response to the change in the Column Address Strobe latency number comprises inserting at least one additional clock pulse into the clock signal during each of a plurality of read or write operations.

10. The method of claim 9, wherein modifying the clock signal that is provided to the semiconductor device in response to the change in the Column Address Strobe latency number comprises selectively providing a first clock signal or a second clock signal to the semiconductor device, wherein the second clock signal is used to selectively replace a pulse of the first clock signal with at least two pulses.

11. The method of claim 10, wherein the second clock signal comprises a latency increasing clock signal that is generated by a signal generator.

12. A semiconductor test device, comprising:

an automatic test device that is configured to output a clock signal having a first pulse width and a first pulse frequency and a plurality of data signals; and a clock pulse insertion circuit that is configured to selectively insert clock pulses into the clock signal output by the automatic test device, wherein the inserted clock pulses have the first frequency and the first pulse width.

13. A semiconductor test device, comprising:

an automatic test device that is configured to output a clock signal and a plurality of data signals; and a clock pulse insertion circuit that is configured to selectively insert clock pulses into the clock signal output by the automatic test device wherein the clock pulse insertion circuit is configured to selectively insert clock pulses into the clock signal in response to an increase in a Column Address Strobe latency number.

14. The semiconductor test device of claim 13, wherein the clock pulse insertion circuit comprises a multiplexer that is configured to selectively output the clock signal from the automatic test device and a second clock signal.

15. The semiconductor test device of claim 14, wherein the clock pulse insertion circuit further comprises an OR gate that is configured to receive both the clock signal from the automatic test device and a latency changing timing signal, and wherein the inputs to the multiplexer comprise the clock signal from the automatic test device and the output of the OR gate.

16. The semiconductor test device of claim 14, wherein the automatic test device comprises:

a clock signal generator that is configured to generate the clock signal;

a pattern generator that is configured to generate an address pattern, a data pattern, a control pattern and an insertion clock signal generation control signal in response to the clock signal;

a pattern data selector that is configured to allocate channels to the address pattern, the data pattern, the control pattern and the insertion clock signal generation control signal;

a signal generator that is configured to generate test data and a latency-increasing timing signal in response to the pattern data output from the pattern data selector and the clock signal; and a buffer circuit section that is configured to buffer and output the test data to a device under test and to buffer and output the latency-increasing timing signal to the clock pulse insertion circuit.

17. A semiconductor test device comprising:

a clock signal generator that is configured to generate a timing clock signal in response to a timing control signal;

a pattern generator that is configured to receive the timing clock signal and generate an address pattern, a data pattern, a control pattern, a timing control signal, and an insertion clock signal generation control signal;

a pattern data selector that is configured to allocate channels to the address pattern, the data pattern, the control pattern, and the insertion clock signal generation control signal;

a signal generator that is configured to generate test data and a latency-increasing timing signal based on the pattern data output from the pattern data selector a buffer driver that is configured to generate a buffer driving signal;

a buffer section that is configured to buffer the test data and the latency-increasing timing signal generated according to the buffer driving signal; and a clock signal inserter that is configured to receive the timing clock signal and the latency-increasing timing signal to generate a latency-increased timing clock signal.

18. The semiconductor test device of claim 17, wherein the clock signal inserter comprises:

a logic gate that is configured to perform a logical OR operation on the timing clock signal and the Column Address Strobe latency-increasing signal to generate a clock signal inserted to increase the Column Address Strobe latency; and a MUX for selectively outputting the timing clock signal and the clock signal inserted to increase the Column Address Strobe latency during a Column Address Strobe latency-increasing interval of the timing clock signal according to the timing control signal.

* * * * *